United States Patent
Tan et al.

(10) Patent No.: US 9,754,939 B2
(45) Date of Patent: Sep. 5, 2017

(54) INTEGRATED CIRCUITS HAVING MULTIPLE GATE DEVICES WITH DUAL THRESHOLD VOLTAGES AND METHODS FOR FABRICATING SUCH INTEGRATED CIRCUITS

(71) Applicant: GLOBALFOUNDRIES Singapore Pte. Ltd., Singapore (SG)

(72) Inventors: Shyue Seng Tan, Singapore (SG); Kiok Boone Elgin Quek, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/938,499

(22) Filed: Nov. 11, 2015

(65) Prior Publication Data
US 2017/0133373 A1    May 11, 2017

(51) Int. Cl.
*H01L 27/092* (2006.01)
*H01L 29/66* (2006.01)
*H01L 21/8238* (2006.01)

(52) U.S. Cl.
CPC .. *H01L 27/0922* (2013.01); *H01L 21/823807* (2013.01); *H01L 21/823821* (2013.01); *H01L 21/823842* (2013.01); *H01L 27/0924* (2013.01); *H01L 29/66537* (2013.01); *H01L 29/66803* (2013.01)

(58) Field of Classification Search
CPC ......... H01L 27/0922; H01L 21/823821; H01L 21/823807; H01L 21/823842; H01L 29/66537; H01L 27/0924; H01L 29/66803

USPC .......................................................... 257/369
See application file for complete search history.

(56) References Cited

U.S. PATENT DOCUMENTS

| 6,853,020 | B1 * | 2/2005 | Yu ..................... H01L 21/26586 257/250 |
| 6,858,478 | B2 * | 2/2005 | Chau ...................... B82Y 10/00 257/E29.137 |
| 2004/0217433 | A1 * | 11/2004 | Yeo ................... H01L 21/26586 257/412 |

(Continued)

OTHER PUBLICATIONS

Aparin et al., "Modifiied Derivative Superposition Method for Linearizing FET Low-Noise Amplifiers", IEEE Transacations on Microwave Theory and Techniques, Feb. 2005, pp. 571-581, vol. 53. No. 2.

(Continued)

*Primary Examiner* — Karen Kusumakar
*Assistant Examiner* — Adam S Bowen
(74) *Attorney, Agent, or Firm* — Lorenz & Kopf, LLP

(57) ABSTRACT

Integrated circuits including multiple gate devices with dual threshold voltages and methods for fabricating such integrated circuits are provided. An exemplary method for fabricating an integrated device includes providing a semiconductor fin structure overlying a semiconductor substrate. The semiconductor fin structure has a first sidewall, a second sidewall opposite the first sidewall, and an upper surface. The method includes forming a first gate along the first sidewall of the semiconductor fin structure with a first threshold voltage. Further, the method includes forming a second gate along the second sidewall of the semiconductor fin structure with a second threshold voltage different from the first threshold voltage.

18 Claims, 4 Drawing Sheets

(56) References Cited

U.S. PATENT DOCUMENTS

2006/0214231 A1* 9/2006 Shah ................. H01L 29/42384
                                                     257/347
2008/0048273 A1* 2/2008 Lenoble ............ H01L 21/26586
                                                     257/401

OTHER PUBLICATIONS

Kim et al., "Highly Linear Receiver Front-End Adopting MOSFET Transconductance Linearization by Multiple Gated Transistors", IEEE Journal of Solid-State Circuits, Jan. 2004, pp. 223-229, vol. 39, No. 1.

* cited by examiner

INTEGRATED CIRCUITS HAVING MULTIPLE GATE DEVICES WITH DUAL THRESHOLD VOLTAGES AND METHODS FOR FABRICATING SUCH INTEGRATED CIRCUITS

TECHNICAL FIELD

The technical field generally relates to integrated circuits and methods for fabricating integrated circuits, and more particularly relates to integrated circuits including multiple gate devices with dual threshold voltages and methods for fabricating integrated circuits including multiple gate devices with dual threshold voltages.

BACKGROUND

In modern integrated circuits, a huge number of individual circuit elements, such as field effect transistors, are formed on a single chip area. Typically, feature sizes of these circuit elements are reduced with the introduction of every new circuit generation, to provide currently available integrated circuits with high performance in terms of speed and/or power consumption. A reduction in size of transistors is an important aspect in steadily improving device performance of complex integrated circuits, such as CPUs. The reduction in size commonly brings about an increased switching speed, thereby enhancing signal processing performance.

At reduced sizes, field effect transistors may exhibit poor linearity for use as amplifiers. The linearity of transistor amplifiers is poor because the drain current of a transistor is a nonlinear, power-law function of its gate-to-source voltage. The mechanisms that produce this undesirable trait are inherent in the fundamental physical properties of field effect transistors. Nonlinearity of transistor amplifiers is generally due to transconductance ($g_m$) nonlinearity in the driving transistor. Linearity of radio frequency (RF) devices is important because non-linearity introduces many problems, including gain compression, cross modulation and intermodulation.

In contrast to conventional planar metal-oxide-semiconductor field effect transistors, multiple gate ("multigate") transistors incorporate two or more gates into a single device. Relative to single gate transistors, multigate transistors reduce off-state current leakage, increase on-state current flow, and reduce overall power consumption. Multigate devices having non-planar topographies also tend to be more compact than conventional planar transistors and consequently permit higher device densities to be achieved.

One known type of non-planar, multigate transistor, commonly referred to as a "finFET," includes two or more parallel fins ("fin structures") formed on a substrate, such as a silicon-on-insulator substrate. The fin structures extend along a first axis between common source and drain electrodes. At least one conductive gate structure is formed over the fin structures and extends along a second axis generally perpendicular to the first axis. More specifically, the gate extends across and over the fin structures such that an intermediate region of the gate conformally overlays three surfaces of each fin (i.e., an upper surface, a first sidewall surface, and a second opposing sidewall surface of each fin). The surfaces form the channel of the gate.

While providing the advantages noted above, conventional finFETs also exhibit poor linearity for use as amplifiers. Accordingly, it is desirable to provide integrated circuits and methods for fabricating integrated circuits with transistor devices having improved linearity for used as amplifiers. Also, it is desirable to provide integrated circuits and methods for fabricating integrated circuits including multiple gate devices with dual threshold voltages. Furthermore, other desirable features and characteristics will become apparent from the subsequent detailed description and the appended claims, taken in conjunction with the accompanying drawings and the foregoing technical field and background.

BRIEF SUMMARY

Integrated circuits including multiple gate devices with dual threshold voltages and methods for fabricating such integrated circuits are provided. In one embodiment, a method for fabricating an integrated device includes providing a semiconductor fin structure overlying a semiconductor substrate. The semiconductor fin structure has a first sidewall, a second sidewall opposite the first sidewall, and an upper surface. The method includes forming a first gate along the first sidewall of the semiconductor fin structure with a first threshold voltage. Further, the method includes forming a second gate along the second sidewall of the semiconductor fin structure with a second threshold voltage different from the first threshold voltage.

In another embodiment, a method for fabricating an integrated circuit having a finFET with dual threshold voltages includes providing a semiconductor fin structure overlying a semiconductor substrate. The semiconductor fin structure has a first sidewall, a second sidewall opposite the first sidewall, and an upper surface. The method forms a first doped region along the first sidewall and forms a first gate structure over the first sidewall. A first gate with a first threshold voltage is defined by first doped region and the first gate structure. The method forms a second doped region along the second sidewall and a second gate structure over the second sidewall. A second gate with a second threshold voltage different from the first threshold voltage is defined by second doped region and the second gate structure.

In yet another embodiment, an integrated circuit is provided. The integrated circuit includes a semiconductor fin structure overlying a semiconductor substrate and having a first sidewall, a second sidewall opposite the first sidewall, and an upper surface. The integrated circuit also includes a gate structure overlying the first sidewall and the second sidewall. The integrated circuit includes a first gate defined along the first sidewall of the semiconductor fin structure with a first threshold voltage. Further, the integrated circuit includes a second gate defined along the second sidewall of the semiconductor fin structure with a second threshold voltage different from the first threshold voltage.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

Embodiments of integrated circuits including multiple gate devices with dual threshold voltages and methods for fabricating such integrated circuits will hereinafter be described in conjunction with the following drawing figures, wherein like numerals denote like elements, and wherein.

DETAILED DESCRIPTION

Figure 1:
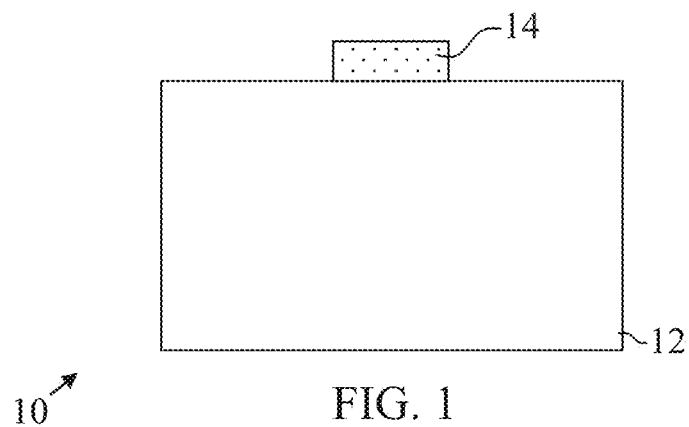
FIGS. 1-6 illustrate, in cross-sectional view, a portion of a partially fabricated integrated circuit during formation of a fin structure over a semiconductor substrate and method steps for fabricating such an integrated circuit in accordance with various embodiments herein.

The following detailed description is merely exemplary in nature and is not intended to limit the integrated circuits including multiple gate devices with dual threshold voltages or the methods for fabricating such integrated circuits. Furthermore, there is no intention to be bound by any expressed or implied theory presented in the preceding technical field, background or brief summary, or in the following detailed description.

For the sake of brevity, conventional techniques related to conventional integrated circuit fabrication may not be described in detail herein. Moreover, the various tasks and processes described herein may be incorporated into a more comprehensive procedure or process having additional processes or functionality not described in detail herein. In particular, various processes in semiconductor processing and the fabrication of integrated circuits are well-known and so, in the interest of brevity, many conventional processes will only be mentioned briefly herein or will be omitted entirely without providing the well-known process details. Further, it is noted that integrated circuits include a varying number of components and that single components shown in the illustrations may be representative of multiple components.

As used herein, it will be understood that when an element or layer is referred to as being "over" another element or layer, it may be directly on the other element or layer, or intervening elements or layers may be present. When an element or layer is referred to as being "on" another element or layer, it is directly on and in contact with the other element or layer. Further, spatially relative terms, such as "vertical", "horizontal", "upper", "over", "lower", "under" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "over" other elements or features would then be oriented "below" the other elements or features. Thus, the exemplary term "over" can encompass either an orientation of above or below. The device may be otherwise oriented (rotated 90 degrees or at other orientations) and the spatially relative descriptors used herein may likewise be interpreted accordingly.

As described herein, a method is provided for forming an integrated circuit having a multiple gate device with dual threshold voltages. In an exemplary embodiment, the multiple gate device is formed with a first gate on a first sidewall of a fin structure and a second gate on an opposite second sidewall of the fin structure. Further, the first gate and the second gate may be processed differently to exhibit different threshold voltages. For example, the first sidewall and the second sidewall of the fin structure may be doped differently to form different doped regions. Such embodiments allow for tuning threshold voltage via implant processing. Alternatively or additionally, a gate structure formed over the first sidewall of the fin structure may be formed with a different work function than a gate structure formed over the second sidewall of the fin structure. As a result, the first gate exhibits a first threshold voltage and the second gate exhibits a second threshold voltage different from the first threshold voltage.

Such gates may be arranged in an integrated circuit as a main transistor and supplemental transistor that are linearly superposed in parallel. Such an arrangement may be used to provide for peak cancellation of the negative peak value of second order transconductance ($g_{m3}$) of the main transistor with the positive peak value of second order transconductance of the auxiliary transistor. In such an arrangement, transistor linearity is improved, i.e., $g_{m1}/g_{m3}$ is increased. In an exemplary embodiment, $g_{m3}$ is estimated to be reduced by greater than 90% as compared to conventional transistor amplifiers.

Figure 7:
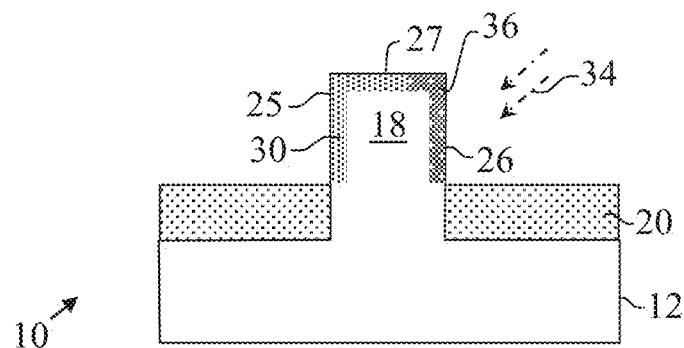
FIGS. 7-9 illustrate, in cross-sectional view, processing of the fin structure depicted in FIG. 6, to form a multiple gate device with dual threshold voltages in accordance with an embodiment herein.
Figure 8:
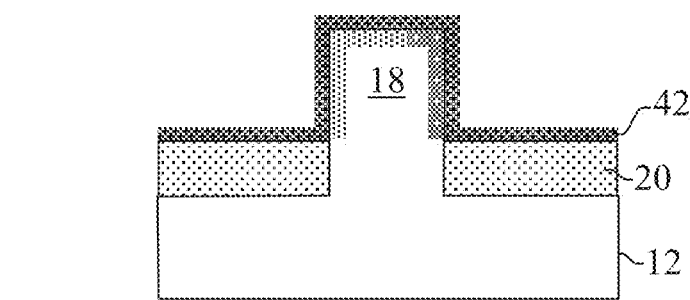
Figure 9:
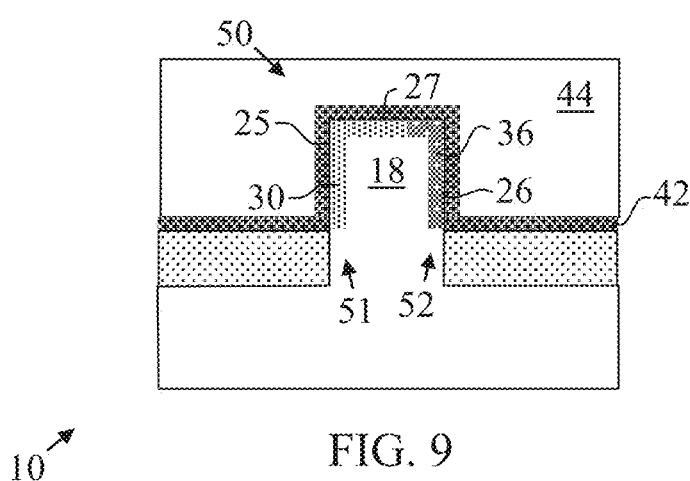
Figure 10:
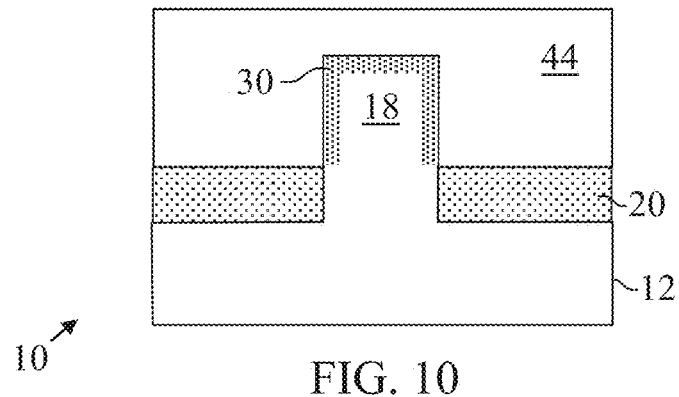
FIGS. 10-12 illustrate, in cross-sectional view, processing of the fin structure depicted in FIG. 6, to form a multiple gate device with dual threshold voltages in accordance with another embodiment herein.
Figure 11:
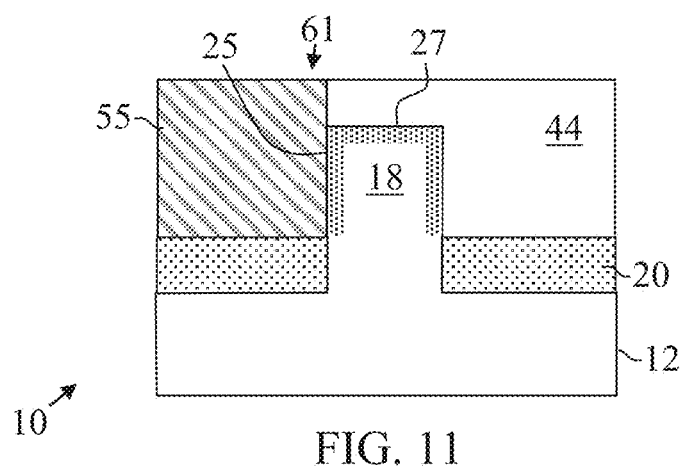
Figure 12:
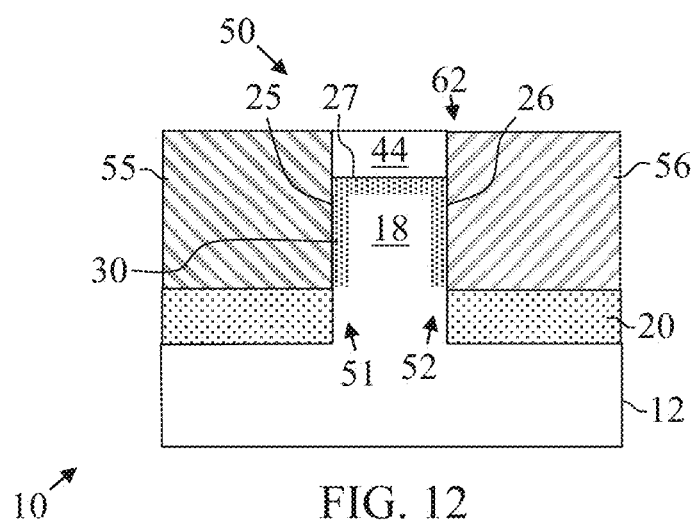

FIGS. 1-6 illustrate processing of a semiconductor substrate to form a semiconductor fin structure. FIGS. 7-9 illustrate processing of the semiconductor fin structure to form a multiple gate device having dual threshold voltages, i.e., a first gate with a first threshold voltage and a second gate with a second threshold voltage, through selective doping of the opposite sidewalls of the fin structure. FIGS. 10-12 illustrate additional or alternative processing of the semiconductor fin structure to form a multiple gate device having dual threshold voltages, i.e., a first gate with a first threshold voltage and a second gate with a second threshold voltage, through use of separate gate structures having different work functions.

In FIG. 1, a semiconductor substrate 12 is provided and processed. It is to be appreciated that various fabrication techniques may be conducted in accordance with the methods described herein to form the semiconductor substrate 12 as shown. Herein, the term "semiconductor substrate" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. The semiconductor substrate 12 may include a compound semiconductor such as silicon carbide, silicon germanide, gallium arsenide, indium arsenide, indium gallium arsenide, indium gallium arsenide phosphide, or indium phosphide and combinations thereof. In an exemplary embodiment, the semiconductor material is a silicon substrate. As referred to herein, a material that includes a recited element/compound includes the recited element/compound in an amount of at least 25 weight percent based on the total weight of the material unless otherwise indicated. An exemplary semiconductor substrate 12 may be bulk wafer or a semiconductor-on-insulator (SOI) type substrate.

In FIG. 1, a hard mask 14 is formed and patterned over the semiconductor substrate 12. An exemplary hard mask 14 is a silicon nitride and may be patterned using a photoresist deposition/development and lithography process. The hard mask 14 covers a region of the semiconductor substrate 12 where a fin structure will be formed and exposes adjacent regions where trenches will be formed.

Figure 2:
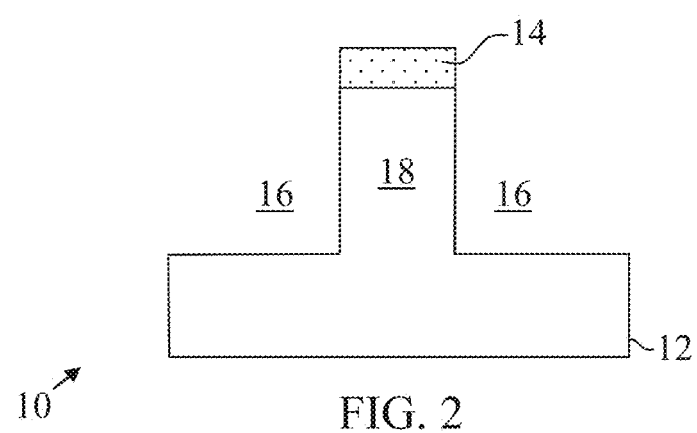

In FIG. 2, a recess process has been performed to form trenches 16 around a fin structure 18 formed from the semiconductor substrate 12. An etch, such as a plasma silicon etch or a wet etch, for example a wet etch using potassium hydroxide (KOH) or tetramethyl ammonium hydroxide (TMAH), may be performed to remove exposed portions of the semiconductor substrate 12. The exemplary etch process is anisotropic.

Figure 3:
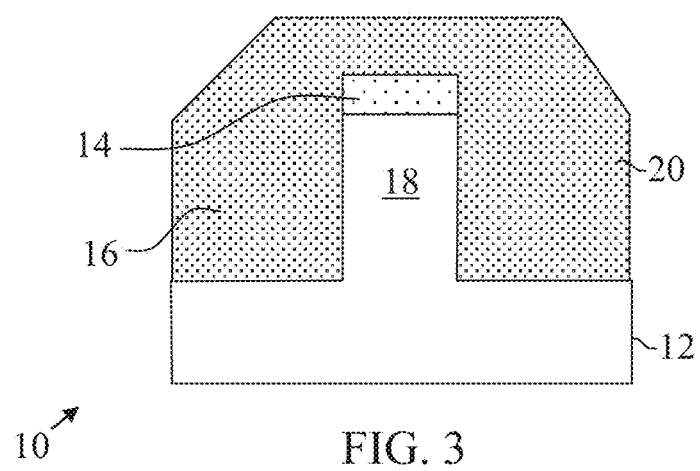

The method may continue in FIG. 3 with the deposition of an insulator material 20 over the hard mask 14, the fin structure 18 and the semiconductor substrate 12 underlying the trenches 16. An exemplary insulator material 20 is silicon oxide. In an exemplary embodiment, the insulator material 20 is deposited by chemical vapor deposition (CVD).

Figure 4:
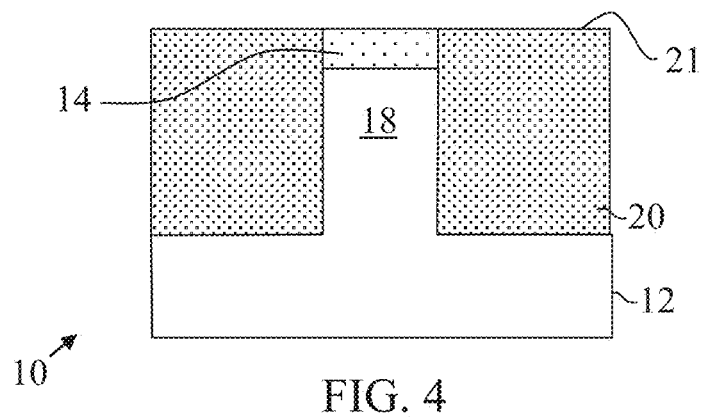

In FIG. 4, a planarization process is performed. Specifically, the insulator material 20 is planarized to the surface of the hard mask 14. An exemplary planarization process is chemical mechanical planarization (CMP). The planarization process results in the formation of a planar upper surface 21 of the insulator material 20.

Figure 5:
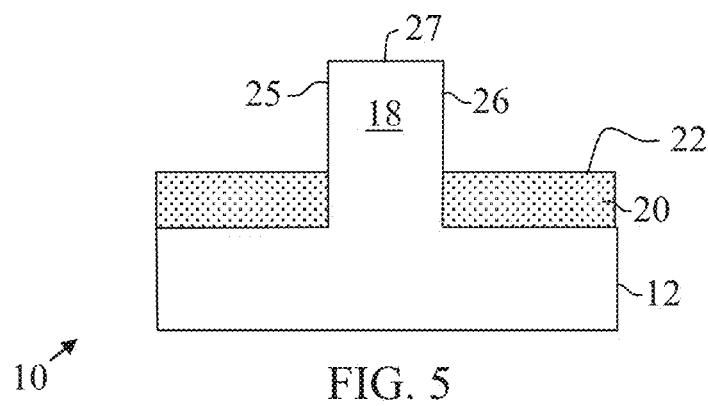

In FIG. 5, the insulator material 20 is recessed to a planar recessed surface 22. Further, the hard mask 14 (shown in FIG. 4) is removed. In an exemplary embodiment, a timed wet etch is performed to simultaneously recess the insulator material 20 and remove the hard mask 14. As a result, the partially fabricated integrated circuit 10 is formed with a fin structure 18 having an exposed first sidewall 25, an exposed opposite second sidewall 26, and an exposed upper surface 27 interconnecting the first sidewall 25 and the second sidewall 26.

Figure 6:
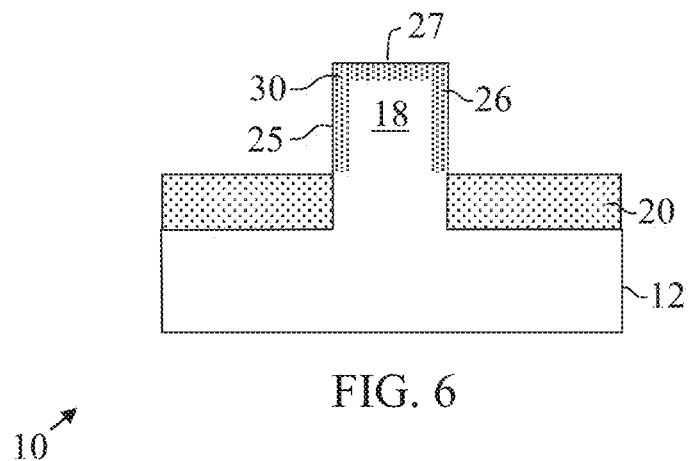

In FIG. 6, a doping process is performed to form a doped region 30 along the first sidewall 25, the second sidewall 26, and the upper surface 27 of the fin structure 18. The doping process may include a dopant ion implantation and/or an in situ epitaxial deposition. In an exemplary embodiment, an N-type dopant ion is implanted into the fin structure 18 at the first sidewall 25, the second sidewall 26, and the upper surface 27 via a plasma doping process. Alternatively, in situ N-doped epitaxial material is grown on the first sidewall 25, the second sidewall 26 and the upper surface 27. Of course, P-type dopants may be used if suitable for the desired device to be fabricated.

The processes of FIGS. 1-6 form the partially fabricated integrated circuit 10 with a fin structure 18 having uniformly doped sidewalls 25 and 26. FIGS. 7-9 illustrate further processing of the structure shown in FIG. 6 to form a multiple gate device having dual threshold voltages. Specifically, the process of FIGS. 7-9 causes the sidewalls 25 and 26 of the fin structure 18 to be differently doped, and thus to exhibit different threshold voltages after gate formation.

As shown in FIG. 7, an additional doping process is performed to selectively dope the second sidewall 26 of the fin structure 18. The additional doping process may include a dopant ion implantation and/or an in situ epitaxial deposition. In FIG. 7, an implantation process is illustrated with dopant ions 34 being directed toward the second sidewall 26 at an angle such that the first sidewall 25 is shielded from the dopant ions 34 by the rest of the fin structure 18. As a result, the second sidewall wall 26 is further doped to form a doped region 36 different from the doped region 30 on the first sidewall 25. In an exemplary embodiment, the doped region 30 is formed by implanting P-type dopants, such as B, $BF_2$ or In. In an exemplary embodiment, $BF_2$ is implanted with an energy of from about 10 KeV to about 40 KeV, with a dose of from about 1E12 to about 1E14 $cm^{-2}$, and with a tilt angle of from about 7 to about 30 degrees. In such an embodiment, the doped region 36 may be formed by an additional high angle implant with a tilt angle of from about 15 to about 45 degree (depending on the fin height). The dopant, energy, and dosage for the additional implant to form doped region 36 may be the same as in the implantation process for forming doped region 30. Alternatively, the first sidewall 25 could be masked while an in situ epitaxial process is performed to form doped region 36.

In FIG. 8, the method may continue with the formation of a gate insulator layer 42. As shown, the gate insulator layer 42 is formed by conformal deposition of an insulator material over the insulator material 20 and the fin structure 18. An exemplary insulator material is silicon oxide. In an exemplary embodiment, the gate insulator layer 42 is formed by depositing insulator material by chemical vapor deposition (CVD).

As shown in FIG. 9, the method then forms a gate structure 44 over the gate insulator layer 42. In an exemplary embodiment, the gate structure 44 is formed from polycrystalline silicon. Alternatively, the gate structure 44 may be formed from a metal or layers of metal. In an exemplary embodiment, the gate structure 44 is planarized, such as by CMP. A sacrificial gate structure may be formed over fin structure 18 and removed before gate structure 44 is formed. Further processing on the semiconductor substrate 12 may include source/drain formation and interlayer dielectric formation and planarization.

As a result of the processing of FIGS. 7-9, the partially fabricated integrated circuit 10 is formed with a multiple gate device 50 including a first gate 51 formed at the first sidewall 25 of the semiconductor fin structure 18 by the doped region 30 (serving as a channel region) and the gate structure 44, and a second gate 52 formed at the second sidewall 26 of the semiconductor fin structure 18 by the doped region 36 (serving as a channel region) and the gate structure 44. Due to the difference in doping of the doped regions 30 and 36, the first gate 51 and the second gate 52 exhibit different threshold voltages. In an exemplary embodiment, the second gate 52 exhibits a higher threshold voltage than the first gate 51.

FIGS. 10-12 illustrate alternative or additional processing of the structure shown in FIG. 6 to form a multiple gate device having dual threshold voltages. Specifically, the process of FIGS. 10-12 provides different gate structures having different work functions over the sidewalls 25 and 26 of the fin structure 18. A "work function" is generally described as the energy, usually measured in electron volts, needed to remove an electron from the Fermi level to a point immediately outside the solid surface or the energy needed to move an electron from the Fermi level into vacuum. Work function is a material property of any material, whether the material is a conductor, semiconductor, or dielectric. For a metal, the Fermi level lies within the conduction band, indicating that the band is partly filled. For an insulator, the Fermi level lies within the band gap, indicating an empty conduction band. For insulators, the minimum energy to remove an electron is about the sum of half the band gap and the electron affinity. An effective work function is defined as the work function of metal on the dielectric side of a metal-dielectric interface. Thus, gate structures having different work functions provide for gates exhibiting different threshold voltages.

In FIG. 10, a gate structure 44 is formed over the semiconductor fin structure 18 and the insulator material 20.

Optionally, a gate insulator layer (not shown) may be first formed over the semiconductor fin structure 18 and the insulator material 20 as shown in FIG. 8. In an exemplary embodiment, the gate structure 44 is formed from polycrystalline silicon. In an exemplary embodiment, the gate structure 44 is planarized, such as by CMP. The gate structure 44 formed over fin structure 18 is sacrificial such that portions are removed as described below. After formation of the gate structure 44, further processing may be performed on the semiconductor substrate 12 including source/drain formation and interlayer dielectric formation and planarization.

In FIG. 11, the method may continue with the removal of the portion 61 of the sacrificial gate structure 44 adjacent the first sidewall 25 of the semiconductor fin structure 18. For example, a mask (not shown) may be formed and patterned over the gate structure 44 to expose the portion 61 of the sacrificial gate structure 44 adjacent the first sidewall 25 of the semiconductor fin structure 18. The portion 61 of the sacrificial gate structure 44 is etched to expose the sidewall 25 of the fin structure 18 and the adjacent portion of the insulator material 20. It is noted that while the etch in FIG. 11 is aligned with the first sidewall 25 of the semiconductor fin structure 18, the etch need not be so aligned and can land on the upper surface 27 of the semiconductor fin structure 18. In an exemplary embodiment, the etch process is performed by plasma or wet etch.

Then a metal gate formation process is performed to form first metal gate structure 55. For example, barrier layers and layers of work function determining metals such as manganese, titanium, chromium, tungsten, molybdenum, palladium, gold, platinum, or alloys thereof, may be deposited in succession and planarized to form first metal gate structure 55. Such metals may be deposited, for example, by atomic layer deposition (ALD). As a result of the selection of work function determining metals, first metal gate structure 55 is formed with a first work function.

In FIG. 12, the method removes the portion 62 of the sacrificial gate structure 44 adjacent the second sidewall 26 of the semiconductor fin structure 18. For example, a mask (not shown) may be formed and patterned over the gate structure 44 to expose the portion 62 of the sacrificial gate structure 44 adjacent the second sidewall 26 of the semiconductor fin structure 18. The portion 62 of the sacrificial gate structure 44 is etched to expose the second sidewall 26 of the fin structure 18 and the adjacent portion of the insulator material 20. It is noted that while the etch in FIG. 12 is aligned with the second sidewall 26 of the semiconductor fin structure 18, the etch need not be so aligned and can land on the upper surface 27 of the semiconductor fin structure 18. In an exemplary embodiment, a portion of the gate structure 44 remains located between the first metal gate structure 55 and the portion 62. Also, in an exemplary embodiment, the etch process is performed by plasma or wet etch.

A metal gate formation process is then performed to form second metal gate structure 56 adjacent the second sidewall 26. For example, as described above in relation to FIG. 11, barrier layers and layers of work function determining metals such as manganese, titanium, chromium, tungsten, molybdenum, palladium, gold, platinum, or alloys thereof, may be deposited in succession and planarized to form second metal gate structure 56. Such metals may be deposited, for example, by ALD. As a result of the selection of work function determining metals, second metal gate structure 56 is formed with a second work function different from the first work function.

The processing of FIGS. 10-12 provides the partially fabricated integrated circuit 10 with a multiple gate device 50 including a first gate 51 formed at the first sidewall 25 of the semiconductor fin structure 18 by the doped region 30 (serving as a channel region) and the first metal gate structure 55, and a second gate 52 formed at the second sidewall 26 of the semiconductor fin structure 18 by the doped region 30 (serving as a channel region) and the second metal gate structure 56. In such an embodiment, the gates 51 and 52 are formed with doped regions 30 having the same dopant profile. Due to the difference in work function of the metal gate structures 55 and 56, the first gate 51 and the second gate 52 exhibit different threshold voltages. In an exemplary embodiment, the second gate 52 exhibits a higher threshold voltage than the first gate 51.

The integrated circuits and fabrication methods described herein result in multiple gate devices 50 having dual threshold voltages, i.e., two gates with two different threshold voltages. Thus, the chip space or footprint used by such a multiple gate device to form two gates with two different threshold voltages is reduced as compared to conventional processing. Further, such multiple gate devices may provide improved linearity performance in amplifiers as compared to conventional devices.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for fabricating an integrated circuit, the method comprising:
   etching a semiconductor substrate to form a semiconductor fin structure with a first sidewall, a second sidewall opposite the first sidewall, and an upper surface;
   doping the semiconductor fin structure through the first sidewall to form a first doped region adjacent the first sidewall of the semiconductor fin structure;
   doping the semiconductor fin structure through the second sidewall to form a second doped region adjacent the second sidewall of the semiconductor fin structure, wherein the second doped region is doped differently from the first doped region;
   forming a first gate along the first sidewall of the semiconductor fin structure; and
   forming a second gate along the second sidewall of the semiconductor fin structure;
   wherein the first gate has a first threshold voltage and the second gate has a second threshold voltage different from the first threshold voltage.

2. The method of claim 1 wherein:
   doping the semiconductor fin structure through the first sidewall to form the first doped region comprises performing a first implantation process and doping the semiconductor fin structure through the first sidewall and the semiconductor fin structure through the second sidewall, wherein the first implantation process forms the first doped region; and doping the semiconductor fin structure through the second sidewall to form the second doped region comprises performing a second implantation process and selectively doping the semiconductor fin structure through the second sidewall, wherein the first implantation process and the second implantation process form the second doped region.

3. The method of claim 1 wherein:
doping the semiconductor fin structure through the first sidewall to form the first doped region comprises performing an in situ doping process and epitaxially depositing an in situ doped material on the first sidewall and on the second sidewall of the semiconductor fin structure, wherein the in situ doping process forms the first doped region; and
doping the semiconductor fin structure through the second sidewall to form the second doped region comprises performing an implantation process and selectively doping the in situ doped material on the second sidewall of the semiconductor fin structure.

4. The method of claim 1 wherein doping the semiconductor fin structure through the second sidewall to form the second doped region comprises performing an angled implantation process while the semiconductor fin structure is unmasked, wherein dopant ions are directed at the second sidewall of the semiconductor fin structure.

5. The method of claim 1 wherein:
forming the first gate along the first sidewall of the semiconductor fin structure comprises forming a first metal gate structure over the first sidewall of the semiconductor fin structure, wherein the first metal gate structure has a first work function; and
forming the second gate along the second sidewall of the semiconductor fin structure comprises forming a second metal gate structure over the second sidewall of the semiconductor fin structure, wherein the second metal gate structure has a second work function different from the first work function.

6. The method of claim 5 wherein doping the semiconductor fin structure through the first sidewall and doping the semiconductor fin structure through the second sidewall to form the doped regions comprises performing an implantation process and doping the semiconductor fin structure through the first sidewall and doping the semiconductor fin structure through the second sidewall.

7. The method of claim 5 wherein doping the semiconductor fin structure through the first sidewall and doping the semiconductor fin structure through the second sidewall to form the doped regions comprises epitaxially depositing an in situ doped material on the first sidewall and on the second sidewall of the semiconductor fin structure.

8. The method of claim 1 further comprising forming a sacrificial gate structure overlying the semiconductor fin structure, and wherein:
forming the first gate along the first sidewall of the semiconductor fin structure comprises:
selectively etching the sacrificial gate structure overlying the first sidewall of the semiconductor fin structure; and
forming a first metal gate structure over the first sidewall of the semiconductor fin structure, wherein the first metal gate structure has a first work function; and
forming the second gate along the second sidewall of the semiconductor fin structure comprises:
selectively etching the sacrificial gate structure overlying the second sidewall of the semiconductor fin structure; and
forming a second metal gate structure over the second sidewall of the semiconductor fin structure, wherein the second metal gate structure has a second work function different from the first work function.

9. The method of claim 1 further comprising forming common source/drain regions in the semiconductor fin structure, wherein the common source/drain regions are shared by the first gate and the second gate.

10. The method of claim 9 further comprising forming a common gate structure overlying the first sidewall and the second sidewall of the semiconductor fin structure.

11. A method for fabricating an integrated circuit having a finFET with dual threshold voltages, the method comprising:
etching a first trench and a second trench into a semiconductor substrate, wherein a semiconductor fin structure is defined from a portion of the semiconductor substrate between a first interface with the first trench and a second interface with the second trench;
forming a first doped region in the semiconductor substrate adjacent the first interface;
forming a first gate structure over the first doped region, wherein a first gate is defined by the first doped region and the first gate structure, and wherein the first gate is configured to operate with a first threshold voltage;
forming a second doped region in the semiconductor substrate adjacent the second interface; and
forming a second gate structure over the second doped region, wherein a second gate is defined by the second doped region and the second gate structure, and wherein the second gate is configured to operate with a second threshold voltage different from the first threshold voltage.

12. The method of claim 11 wherein forming the second doped region comprises doping the second doped region differently from the first doped region.

13. The method of claim 11 wherein:
forming the second doped region comprises doping the second doped region differently from the first doped region, and
forming the first gate structure and forming the second gate structure comprise forming a common gate structure over the first doped region and the second doped region.

14. The method of claim 11 wherein:
forming the first gate structure over the first doped region comprises forming a first metal gate structure with a first work function over the first doped region; and
forming the second gate structure over the second doped region comprises forming a second metal gate structure with a second work function different from the first work function over the second doped region.

15. The method of claim 11 wherein:
forming the first doped region and forming the second doped region comprises using a same doping process to form the first doped region and the second doped region with a same dopant profile;
forming the first gate structure over the first doped region comprises forming a first metal gate structure with a first work function over the first doped region; and
forming the second gate structure over the second doped region comprises forming a second metal gate structure with a second work function different from the first work function over the second doped region.

16. An integrated circuit comprising:
a semiconductor fin structure overlying a semiconductor substrate and having a first sidewall, a second sidewall opposite the first sidewall, and an upper surface, wherein the semiconductor fin structure consists of a semiconductor material that contacts and forms the first sidewall and the second sidewall;
a gate structure overlying the first sidewall and the second sidewall;
a first gate defined along the first sidewall of the semiconductor fin structure; and
a second gate defined along the second sidewall of the semiconductor fin structure;
wherein the integrated circuit is configured to operate with a first threshold voltage across the first gate and to operate with a second threshold voltage across the second gate different from the first threshold voltage.

17. The integrated circuit of claim 16 further comprising:
a first doped region in the semiconductor material of the semiconductor fin structure adjacent the first sidewall; and
a second doped region in the semiconductor material of the semiconductor fin structure adjacent the second sidewall, wherein the second doped region is doped differently from the first doped region.

18. The integrated circuit of claim 16 wherein the gate structure includes a first metal gate structure having a first work function over the first sidewall of the semiconductor fin structure, wherein the first metal gate structure has a first work function, and a second metal gate structure having a second work function over the second sidewall of the semiconductor fin structure, wherein the second work function is different from the first work function.

\* \* \* \* \*